US 6,528,815 B1

(12) United States Patent
Brown et al.

(10) Patent No.: US 6,528,815 B1
(45) Date of Patent: *Mar. 4, 2003

(54) WRITE-ONCE READ-MANY ELECTRICAL MEMORY ELEMENT OF A CONJUGATED POLYMER OR OLIGOMER

(76) Inventors: Adam R. Brown, Groenewoudseweg 1, 5621 BA Eindhoven (NL); Dagobert M. De Leeuw, Groenewoudseweg 1, 5621 Ba Eindhoven (NL); Edsko E. Havinga, Groenewoudseweg 1, 5621 Ba Eindhoven (NL); Colin P. Jarrett, 5 Holmwood Garth, BH24 3DT Hightown Ringwood Hants (GB)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 955 days.

(21) Appl. No.: 08/798,679

(22) Filed: Feb. 12, 1997

(30) Foreign Application Priority Data

Feb. 16, 1996 (EP) .............................. 96200396

(51) Int. Cl.[7] .......................... H01L 29/43; H01L 29/02; H01L 29/86
(52) U.S. Cl. .......................... 257/40; 257/390; 257/529; 257/537
(58) Field of Search .......................... 257/40, 390, 529, 257/537

(56) References Cited

U.S. PATENT DOCUMENTS

| | | |
|---|---|---|
| 4,371,883 A | 2/1983 | Potember et al. .............. 357/8 |
| 4,642,664 A * | 2/1987 | Goldberg ...................... 257/40 |
| 4,945,257 A * | 7/1990 | Marrocco ...................... 338/70 |
| 5,223,750 A * | 6/1993 | Nichogi ........................ 257/40 |

FOREIGN PATENT DOCUMENTS

| | | |
|---|---|---|
| EP | 0115191 A1 | 12/1982 |
| EP | 0232880a2 | 8/1987 |
| EP | 0272935a2 | 6/1988 |
| EP | 0412829a2 | 2/1991 |
| EP | 05197745a2 | 12/1992 |

OTHER PUBLICATIONS

Influence of Chemical Polymerization Conditions on the Properties of Polyaniline Yong Cao, Alejanfro Andreatta, Alan J. Heeger and Paul Smith Institute for Polymers and Organic Solids, University of California, Santa Barbara, CA 93106, USA.

Counter–Ion Induced Processibility of Conducting Polyaniline and of Conducting Polyblends of Polyaniline in Bulk Polymers Young Cao, Paul Smith and Alan J. Heeger, UNIAX Corporation, 5375 Overpass Road, Santa Barbara, CA 93111 (USA).

* cited by examiner

*Primary Examiner*—Jerome Jackson
(74) *Attorney, Agent, or Firm*—Ernestine C. Barlett

(57) ABSTRACT

The invention relates to a write-once read-many memory element (1), or an assembly thereof, which comprises a substrate on which electrodes are provided and between which a layer is sandwiched, which memory element includes a conjugated polymer or oligomer as well as a dopant. This memory element can be written by temporarily applying a sufficiently high voltage to the electrodes so that the electroconductivity of the layer is permanently reduced.

7 Claims, 2 Drawing Sheets

WRITE-ONCE READ-MANY ELECTRICAL MEMORY ELEMENT OF A CONJUGATED POLYMER OR OLIGOMER

BACKGROUND OF THE INVENTION

The invention relates to a write-once read-many electrical memory element which comprises two electrode's between which a layer of a material containing an organic conjugated compound is sandwiched. The invention also relates to the use of a device comprising two electrodes between which a layer containing a conjugated polymer or oligomer as well as a dopant is sandwiched, as a write-once read-many memory element. The invention further relates to an assembly of independently addressable memory elements. The invention also relates to a method of electrically writing information while using such a memory element. The invention finally relates to a method of electrically reading information while using such a memory element.

Write-once read-many electrical memory elements, as well as memories derived therefrom, in particular those in which the memory is an integrated circuit or forms part of an integrated circuit (IC) have been known for a long time. The technology which is customarily used to manufacture such memory elements is based on one crystalline silicon. However, there are applications for which silicon-based IC technology is found to be less suitable, for example "low-end" electronics. "Low-end" electronics is to be understood to mean in this context, electronics which, in terms of performance, does not have to meet high requirements and, consequently, is low in price. An example of such a "low-end" application is electronics intended for one-time use, such as an electronic bar code. An element which could suitably be used in such integrated circuits is a write-once read-many electrical memory element based on an organic semiconductive material.

Such an organic memory element is known per se from U.S. Pat. No. 4,371,883. This known memory element, referred to in this patent as "memory switch", is built up of a metallic substrate of, preferably, silver or copper, which substrate serves as a first electrode carrying a layer of a deposited stoichiometric metal complex of an organic conjugated electron acceptor, such as tetracyanoquinodimethane or tetracyanoethylene, which layer is in contact with a second electrode. If a sufficiently high electric field is applied, then the resistance of the layer changes. As this change in resistance remains intact for some time after the electric field has been removed, this known element is referred to as a "memory switch". However, this known memory element has a number of disadvantages. One of the disadvantages is that the change in resistance remains in tact for maximally a couple of days. Another disadvantage is that the choice of the electrode material is limited because at least one of the electrodes must be made from a metal which complexes with the organic compound, such as silver or copper. The other electrode material cannot be freely selected either because it determines the function of the device, i.e. a diode or a memory element. In addition, the materials of the two electrodes are different, which renders the manufacturing process laborious and expensive. Moreover, the known organic layer is polycrystalline and of low molecular weight. In general, such layers are brittle, so that they are less suitable to form memories having large surfaces on flexible substrates. Besides, in general the properties of devices employing organic polycrystalline layers are poorly reproducible.

SUMMARY OF THE INVENTION

It is an object of the invention to provide, inter alia, a write-once read-many memory element which does not have the above drawbacks. The invention specifically aims at a memory element which can suitably be used in an integrated circuit and in which the information remains intact for at least one month. The writing of the information should take place in a non-destructive manner so that damage to any other elements of the circuit of which the memory element could form part is precluded. It should be possible to choose and, if necessary, manufacture the electrode material and the organic layer independently. If necessary, it should be possible to make both electrodes from the same material. Further, the memory element should be stable under ambient conditions. The organic layer should be amorphous and it should be possible to provide said layer by means of simple, inexpensive techniques which are suitable for integration. An example of such a technique is spin coating.

These and other objects are achieved by a memory element of the type mentioned in the opening paragraph, which is characterized in accordance with the invention in that the layer comprises a dopant, the material is soluble, the compound is a polymer or an oligomer, and the electroconductivity of the layer in a written state is permanently lower than in an unwritten state.

As will be described in greater detail hereinbelow, it has been found that a difference in electroconductivity can be brought about by applying a suitable voltage between the electrodes. If the memory element has been subjected to such a voltage, then it is in the written state. If it has not been subjected to such a voltage, then it is in the unwritten state. A degree of conductivity in the written state, which is a factor of ten to one million lower than in the unwritten state can be easily achieved. Surprisingly, it has been found that this low conductivity remains substantially in tact for at least a month, even after the voltage is removed. The low conductivity cannot be undone by applying a voltage of comparable magnitude yet opposite polarity. Optical and electron-microscopic recordings show that the difference in electroconductivity is not accompanied by any difference in morphology of the layer, such as a phase separation or (re-)crystallization. Nor does the change lead to a loss of material from the layer or from parts of the layer. In this respect, the layer has not changed and the intended difference in conductivity has been achieved in a non-destructive manner, so that it is precluded that, if the memory element forms part of a larger assembly, other parts become damaged. The memory element proves to be stable under ambient conditions. Special measures for excluding moisture or oxygen proved unnecessary. The layer is amorphous both in the written and the unwritten state. It has also been found that in the voltage range from 0 V to approximately 1 V, the current voltage characteristic of the memory element is ohmic both in the written and the unwritten state, irrespective of the polarity of the applied voltage.

A number of different variants of the memory element can be manufactured in a simple manner. For example, a memory element can be produced in which the electrodes are coplanar and may be manufactured, if desired, from the same material. In this case, use is made of an electrically insulating substrate, such as quartz, glass or a non-conductive synthetic resin, on which the electrodes are provided in accordance with a pattern by means of known techniques, such as sputtering, CVD or vacuum deposition. Dependent upon the required dimensions, the patterns can be formed by means of known methods such as lithography, screen printing or other graphic techniques. The choice of the electrode material is not essential and, inter alia, gold, aluminum, platinum, copper or indium-tin oxide may be selected. Also conductive polymers, such as highly conductive polyaniline can suitably be used as the electrode material. This has the advantage that also the electrodes can be provided by means of simple methods, such as spin coating. Subsequently, the layer of the soluble material containing the conjugated polymer or oligomer and a dopant is provided thereon. This layer can be provided in a simple manner by means of known techniques, such as spin coating, dip coating or spray coating. Apart from wetting, the applicability of such techniques is substantially independent of the properties of the underlying layer. Layer thicknesses of approximately 30 nm to approximately 10 micrometer can be obtained in a reproducible manner, provided that the layer to be provided consists of soluble materials. A soluble material is to be understood to mean in this context, a material which can be processed by means of the above techniques. This condition is met by a material which is dissolved on a molecular level but, in this case, also by a suspension of a material. In general, conductive polymers are poorly processable owing to the rigid character of the conjugated "backbone". A known method of rendering a conductive polymer soluble consists in providing saturated substituents, such as alkyl or alkoxy groups. In this case, however, such an operation may adversely affect the conductivity. Another usable method consists in preparing a suspension of the conductive polymer.

It is known that the electroconductivity of conjugated polymers and oligomers can be increased to values ranging from 0.001 to at least 100 S/cm by adding a dopant. After the addition of a dopant, such a conductivity can be achieved with many conjugated polymers or corresponding oligomers, such as polythiophene, poly-paraphenylene, poly-paraphenylenevinylene or polyaniline, or with polymers or oligomers which are derived therefrom by means of substitution. The dopant should be selected in such a manner that, by means of a redox reaction, the conjugated polymer or oligomer is brought to a different oxidation state. Preferably, use is made of a dopant which is soluble and, apart from the desired redox reaction, does not bring about other reactions which lead to degradation of the material. If the polymer or oligomer must be oxidized, use can be made, for example, of dopants such as iodine, 2,3-dichloro-5,6-dicyano-1,4-benzoquinone (DDQ), iron(III)chloride, iron (III)-paratoluenesulphonate, tetracyanoquinodimethane or nitrosoniumtetrafluoroborate. To reduce the polymer or oligomer use can be made of dopants such as alkali metals, alkali naphtalides or sodium dithionite. The electroconductivity of the layer increases as more dopant is used. In general, it appears that when the quantity of a dopant exceeds 100%, 100% corresponding to 1 electron per repeating unit, there hardly is a further increase of the conductivity. Specific conductive polymers, such as polyaniline, can also be doped with Bronsted acids, such as sulphuric acid or camphor sulphonic acid.

The same techniques and materials also enable a memory element to be obtained in which the electrodes are vertically arranged and separated from each other by the layer of doped, conjugated polymer or doped oligomer.

Using the same techniques and materials, and with similar effort, it is also possible to integrate a plurality of memory elements on one substrate.

A preferred embodiment of the memory element in accordance with the invention is characterized in that the polymer or oligomer comprises substituted or unsubstituted thiophene units. Such polymers and oligomers can be doped relatively easily, are relatively stable in the doped state and exhibit a high electroconductivity. Further, it is possible to substitute the thiophene ring; for example, to increase the solubility, without an essential change of the electronic structure.

By means of substituents in the $3^{rd}$ position and/or $4^{th}$ position, illustrative thiophene-containing compounds form substituted polythiophenes and oligothiophenes, said substituents either being selected independently from the group formed by R or together from the group formed by $-O-CHR_1-CHR_2-O-$ and $-CH=CR_1-CR_2=CH-$, and R, $R_1$ and $R_2$ being selected independently from the group consisting of hydrogen, alkyl, alkoxy and aryl, with the proviso that the number of non-hydrogen atoms contained in a substituent is smaller than 25 because the conductivity decreases due to the decreasing ratio between conjugated and unconjugated parts. It has been found that the use of substituents containing more than approximately 12 non-hydrogen atoms hardly improves the solubility.

A particular, preferred embodiment of the memory element in accordance with the invention is characterized in that the layer comprises a polymer in accordance with formula I or II, or an oligomer in accordance with formula III,

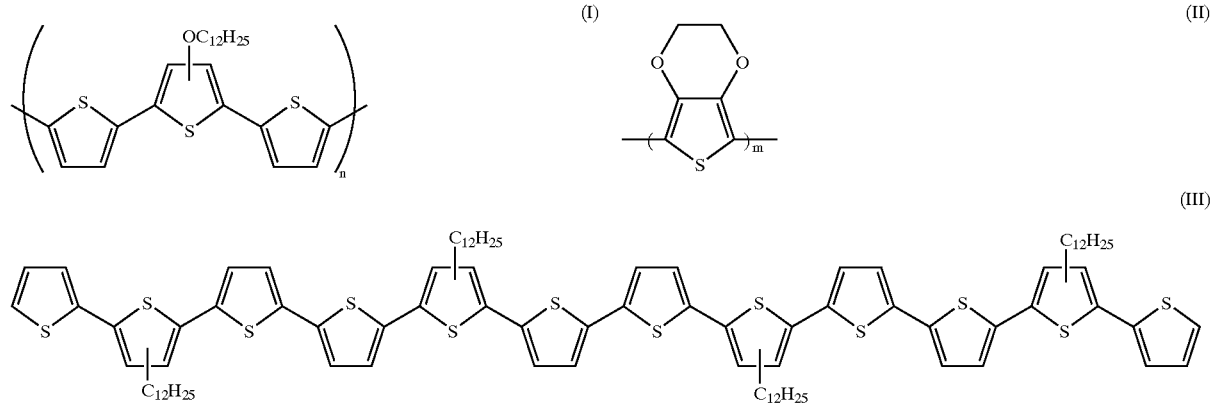

wherein the degree of polymerization n ranges from 2 to 1000 and the degree of polymerization m ranges from 6 to 100.

These commercially available thiophene-containing compounds have the advantage that they are soluble. The conductive polymer in accordance with (III) is available as an aqueous suspension. A further advantage of these compounds is that the oxidation potential ranges between 0 V and +1.0 V, measured with respect to the standard calomel electrode. Compounds whose oxidation potential is in said range generally have a good stability relative to water and oxygen or a combination thereof.

Another preferred embodiment of the memory element in accordance with the invention is characterized in that the layer comprises a doped polyaniline. These compounds have the advantage that the ratio between the conductivity in the written state and the unwritten state is extremely large. In addition, doped polyaniline has a particularly high conductivity and high stability.

The invention also relates to an assembly of independently addressable memory elements, which assembly comprises memory elements in accordance with the invention. The above-described memory element can very advantageously be used if a plurality of such elements is combined in such a manner that they are independently addressable and manufactured in an integrated manner. The electrodes of the memory elements may be coplanar, said electrodes being interdigitated or not. In another configuration, the organic layer is situated between intersecting patterns of row electrodes and column electrodes, such that memory elements are defined at the locations of overlap.

The invention also relates to a method of electrically writing information while using a memory element in accordance with the invention. This method is characterized in accordance with the invention, in that a temporary voltage is applied between the electrodes, such that the electroconductivity of the layer is permanently reduced. Said permanent reduction of the conductivity is neither accompanied by a morphological change of the layer nor by any loss of any component from the layer. It is assumed that said reduction in conductivity is achieved by removing de-doping of the conjugated polymer or oligomer, possibly, in only a part of the layer. The applied voltage may be an alternating voltage or a direct voltage. In a typical example, a voltage of approximately 100 V is applied for 1 s. The conductivity value which is finally attained is governed, inter alia, by the polymer or oligomer, the type and quantity of the dopant, the voltage, the duration of the applied voltage and the layer thickness. It has been found that, at a sufficiently high voltage, there is a minimum duration t' for which it applies that for all durations t which comply with the relationship t>t', the conductivity changes hardly. It has further been found that a given change in conductivity can be achieved in less time by increasing the applied voltage.

The invention finally relates to a method of electrically reading information while using the memory element as claimed in claim 1, characterized in that reading takes place by measuring the electric resistance between the electrodes. The resistance of the layer can be determined in a simple manner by measuring the current at a given voltage or by measuring the voltage at a given current. If necessary, it is also possible to measure the impedance by using an alternating voltage or an alternating current. A suitable application of the memory element requires the voltages used during reading to be so low that the conductivity of the layer remains unchanged. A typical reading voltage is below approximately 10 V, in particular below 3 V.

In European Patent Application EP-A-0115191, a description is given of an electric circuit interrupter which is also referred to as "fuse" by the Applicants. Said fuse comprises, as the active ("actuating") element, a strip of the conductive polymer polypyrrole in a doped form. The current interruption is effected by an increase in resistance of the layer, which occurs as a result of the high current running through the fuse. As a result of the increase in resistance, the quantity of current becomes negligibly small. This takes place without the element being physically destroyed or broken. In a preferred embodiment, the fuse is intentionally blown by adding a strongly oxidizing agent such as picrate. Polypyrrole is always manufactured electrochemically, resulting in a brittle or flexible self-supporting layer.

Another method of preparing an active layer of polypyrrole is neither described nor suggested in said Patent Application. It is inherent in electrochemical synthesis that material can be provided only at locations where an electrode is in contact with the starting materials used to prepare polypyrrole. This limits the number of possible embodiments, particularly the number of integrated embodiments. In particular, the memory elements in the embodiments described hereinbelow cannot be manufactured by means of said known method. Further, the known fuse is a discrete device and hence unsuitable for use as an integrated memory element. The use of the fuse as a memory element is neither mentioned nor suggested.

DESCRIPTION OF THE INVENTION

These and other aspects of the invention will be apparent from and elucidated with reference to the embodiments described hereinafter.

Exemplary Embodiment 1

Figure 5:
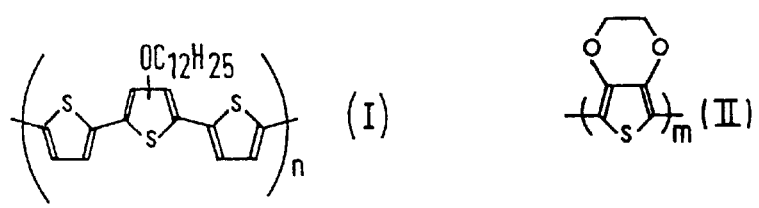
FIG. 5 shows the structural formula of the conjugated polymers (I) and (II), respectively, and of the oligomer (III).
Figure 5:
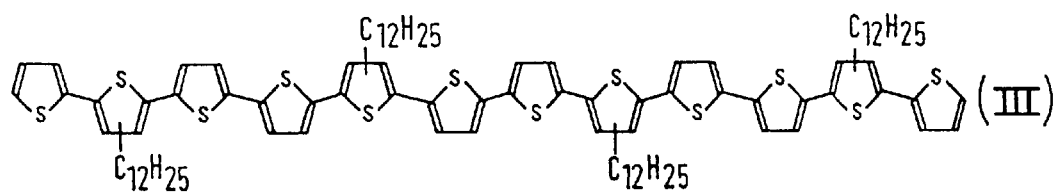

A 1 wt. % solution of the polymer in accordance with formula I in FIG. 5 (Syncom bv. University of Groningen, Netherlands), whose degree of polymerization is approximately 20, is prepared in tetrahydrofuran (THF). DDQ (supplier BDH) is dissolved in equal quantities of THF and chloroform, in such a quantity that the doping level is 10%. A doping level of 10% means that 1 mole of DDQ is available per 10 moles of thiophene rings. A doped solution is prepared by mixing equal quantities of the polymer solution with the solution containing the dopant.

Figure 1:
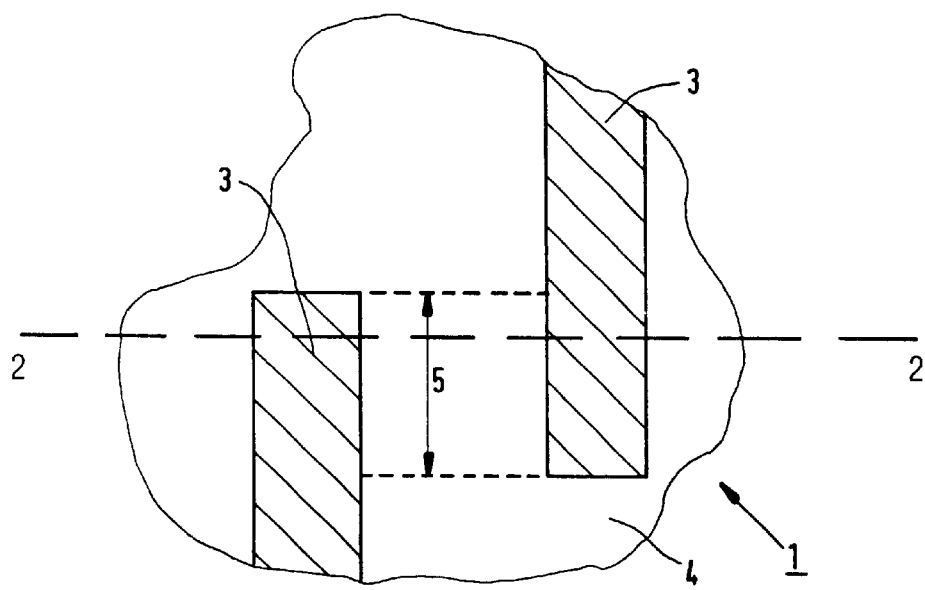
FIG. 1 is a plan view of a memory element in accordance with the invention.
Figure 2:
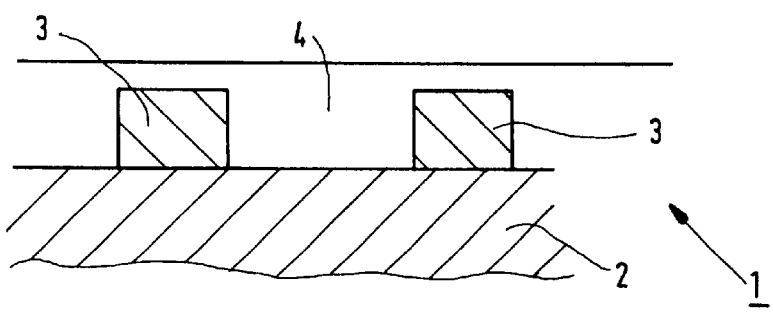
FIG. 2 is a cross-sectional view taken on the line I—I in FIG. 1.

FIGS. 1 and 2 schematically show, not to scale, a plan view and a cross-sectional view, respectively, of a memory element 1. Gold electrodes 3 are provided on a quartz substrate 2. The thickness of the electrodes is 50 nm, the distance between the electrodes is 2 micrometers and the overlap 5 between the electrodes is 10 mm. A layer 4 is provided by spin coating of the solution containing the dopant. The thickness of the layer is 50 nm.

The current voltage characteristic of the memory element thus manufactured is determined before and after writing at a voltage of 100 V for 1 second. The measuring process consists of a "voltage sweep" from −1 V to 1 V and back again to −1 V. Given the dimensions of the element, the following conductivity values are derived from these characteristics at different points in time:

| | |
|---|---|
| before writing | $1.6 \times 10^{-3}$ S/cm, |
| immediately after writing | $0.8 \times 10^{-5}$ S/cm, |
| 7 hours and 20 min. after writing | $1.6 \times 10^{-5}$ S/cm, |
| 25 hours after writing | $2.4 \times 10^{-5}$ S/cm |
| 28 days after writing | $3.2 \times 10^{-5}$ S/cm. |

The conductivity of an identical, yet unwritten, element after 28 days is $1.6 \times 10^{-3}$ S/cm.

Exemplary Embodiment 2

Exemplary embodiment 1 is repeated, however, with a doping level of 100% and a writing voltage of 35 V for 5 minutes, followed by a voltage of 100 V for 1 s. The conductivity is

| | |
|---|---|
| before writing | $8.0 \times 10^{-3}$ S/cm, |
| immediately after writing at 35 V | $6.0 \times 10^{-4}$ S/cm, |
| immediately after writing at 100 V | $0.6 \times 10^{-4}$ S/cm, |
| 18 hours after writing | $1.6 \times 10^{-4}$ S/cm, |
| 28 days after writing | $2.0 \times 10^{-4}$ S/cm. |

The conductivity of an identical, yet unwritten, element after 28 days is $4.2 \times 10^{-3}$ S/cm.

Exemplary Embodiment 3

Exemplary embodiment 1 is repeated, with this difference that the distance between the electrodes is 10 micrometers and writing of the memory element does not take place until after 28 days. The conductivity is

| | |
|---|---|
| before writing | $1.6 \times 10^{-3}$ S/cm, |
| immediately after writing | $2.0 \times 10^{-4}$ S/cm. |

Exemplary Embodiment 4

Exemplary embodiment 1 is repeated, however, with a distance between the electrodes of 5 micrometers, a layer thickness of 30 nm and a doping level of 20%. The conductivity is

| | |
|---|---|
| before writing | $5.0 \times 10^{-3}$ S/cm, |
| immediately after writing | $1.7 \times 10^{-4}$ S/cm. |

Exemplary Embodiment 5

Exemplary embodiment 1 is repeated, however, with a distance between the electrodes of 5 micrometers, a layer thickness of 30 nm and iron (III)chloride instead of DDQ. The conductivity is

| | |
|---|---|
| before writing | $3.3 \times 10^{-2}$ S/cm, |
| immediately after writing | $2.5 \times 10^{-4}$ S/cm. |

Exemplary Embodiment 6

Exemplary embodiment 1 is repeated, however, with a distance between the electrodes of 20 micrometers, a layer thickness of 30 nm, a doping level of 40% and the oligomer in accordance with formula (III) in FIG. 5 (Syncom bv. University of Groningen, Netherlands) instead of the polymer. The conductivity is

| | |
|---|---|
| before writing | $3.3 \times 10^{-1}$ S/cm, |
| immediately after writing | $6.6 \times 10^{-3}$ S/cm. |

Exemplary Embodiment 7

Exemplary embodiment 6 is repeated, however, with a layer thickness of 30 nm, a doping level of 40% and iron(III)chloride instead of DDQ. The conductivity is

| | |
|---|---|
| before writing | $6.6 \times 10^{-2}$ S/cm, |
| immediately after writing | $3.0 \times 10^{-4}$ S/cm. |

For the above examples it applies that writing for more than 1 s does not lead to a further reduction of the conductivity.

Exemplary Embodiment 8

Exemplary embodiment 1 is repeated, however, with the following differences. The substrate is made of glass. The solution to be spun is an aqueous suspension of the polymer in accordance with formula (II) and the dopant is polystyrenesulphonate, as supplied by Bayer AG under the trade name "Laborprodukt PEDT/PSS-zubereitung". After spinning (3 s at 500 rpm, 60 s at 100 rpm) and heating (110° C., 2 minutes) the layer thickness is 100 nm. The distance between the electrodes is 5 micrometers, the thickness of the electrodes is 250 nm and the overlap is 3 mm. A "voltage sweep" from 0.001 V to 1 V is employed. The conductivity is

| | |
|---|---|
| before writing | 1.5 S/cm |
| after writing for 5 s at 30 V | 0.029 S/cm |
| followed by writing for 30 s at 50 V | 0.010 S/cm |

Exemplary Embodiment 9

Exemplary embodiment 8 is repeated, with this difference that the distance between the electrodes is 10 micrometers. The conductivity is

| | |
|---|---|
| before writing | 3.5 S/cm |
| after writing for 2 s at 30 V | 0.042 S/cm |
| followed by writing for 2 s at 90 V | 0.016 S/cm |

Exemplary Embodiment 10

Exemplary embodiment 8 is repeated, with this difference that the solution to be spun is a 3 wt. % solution of polyaniline, synthesized in accordance with the method described by Y. Cao et. al. in Polymer 30, 2305 (1989) and Synth. Met. 48, 91 (1992), and camphorsulphonic acid in cresol, such that the doping level is 50%, which solution is spun (3 s at 500 rpm, 7 s at 2000 rpm) and heated (110° C., 2 minutes) so as to form a layer having a thickness of 300 nm. A further difference is that the distance between the electrodes is 2 micrometers. The conductivity is

| | |
|---|---|
| before writing | > 1.1 S/cm |
| after writing for 30 s at 30 V | $1.0 \times 10^{-3}$ S/cm |
| followed by writing for 30 s at 90 V | $1.4 \times 10^{-5}$ S/cm |

|  |  |
| --- | --- |
| followed by writing for 100 s at 100 V | $1.6 \times 10^{-5}$ S/cm |
| followed by 3 days at zero voltage | $5.9 \times 10^{-5}$ S/cm |

Exemplary Embodiment 11

Exemplary embodiment 10 is repeated, with this difference that the distance between the electrodes is 5 micrometers. The conductivity is

|  |  |
| --- | --- |
| before writing | > 5 S/cm |
| after writing for 30 s at 30 V | $2.7 \times 10^{-3}$ S/cm |
| followed by writing for 30 s at 100 V | $4.8 \times 10^{-5}$ S/cm |
| followed by 3 days at zero voltage | $7.6 \times 10^{-5}$ S/cm. |

After three days an unwritten sample has a conductivity >14 S/cm.

Exemplary Embodiment 12

Exemplary embodiment 10 is repeated, with this difference that the distance between the electrodes is 10 micrometers. The conductivity is

|  |  |
| --- | --- |
| before writing | 15.5 S/cm |
| after writing for 10 s at 10 V | 0.86 S/cm |
| followed by writing for 10 s at 10 V | 0.86 S/cm |
| followed by writing for 10 s at 30 V | 0.31 S/cm |
| followed by writing for 30 s at 30 V | 0.27 S/cm |
| followed by 3 days at zero voltage | 0.30 S/cm. |

Exemplary Embodiment 13

Exemplary embodiment 10 is repeated, with this difference that the distance between the electrodes is 20 micrometers. The conductivity is

|  |  |
| --- | --- |
| before writing | 15 S/cm |
| after writing for 10 s at 30 V | 0.18 S/cm |
| followed by writing for 30 s at 30 V | 0.18 S/cm |
| followed by 3 days at zero voltage | 0.15 S/cm. |

For all of the above exemplary embodiments it applies that the current voltage characteristic of all measurements is ohmic, and throughout the duration of each experiment the memory element is in contact with air.

Exemplary Embodiment 14

Figure 4:
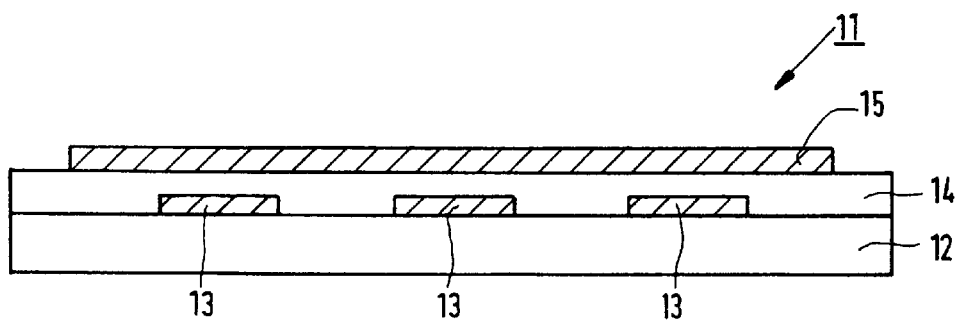
FIG. 4 is a cross-sectional view taken on the line II—II in FIG. 3.
Figure 3:
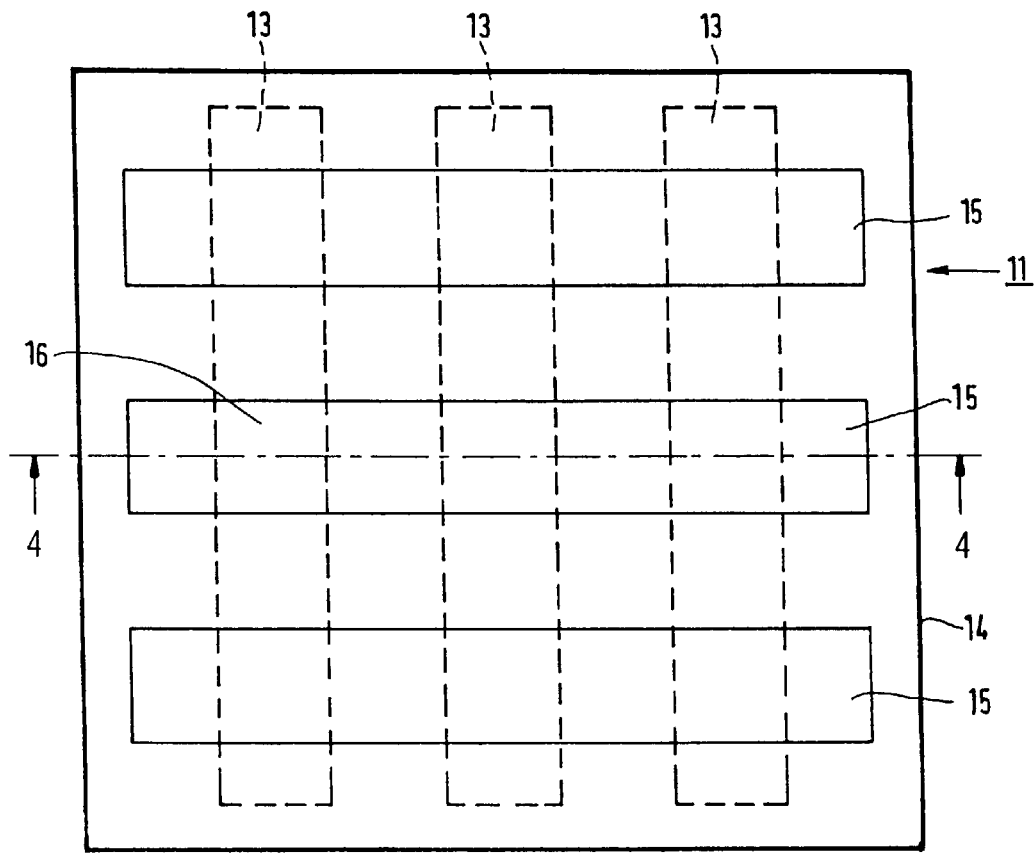
FIG. 3 is a plan view of a matrix of memory elements in accordance with the invention.

FIGS. 3 and 4 schematically show, not to scale, a plan view and a cross-sectional view, respectively, of a matrix of memory elements 11. By means of a mask, gold is vacuum deposited on a glass substrate 12 so as to form column electrodes 13 having a thickness of approximately 50 nm. Subsequently, an 1 micrometer thick layer 14 is provided thereon by spin coating of a solution described in exemplary embodiment 1. The gold row electrodes 15 are formed in an analogous manner. The memory elements 16 are formed where the column and row electrodes overlap, which memory elements can be written by applying a voltage across the relevant electrodes.

We claim:

1. A write once-read many electrical memory element which comprises two electrodes between which electrodes a layer of a material containing an organic conjugated compound is sandwiched, characterized in that the layer comprises a dopant capable, by a redox reaction, of changing the oxidation state of the organic conjugated compound, the material is soluble, the organic conjugated compound is a polymer or an oligomer, and the electroconductivity of the layer in a written state is permanently lower than in an unwritten state.

2. A memory element as claimed in claim 1, characterized in that the polymer or oligomer comprises substituted or unsubstituted thiophene units.

3. A memory element as claimed in claim 2, characterized in that the polymer is selected in accordance with formula I or II, and the oligomer is selected in accordance with formula III

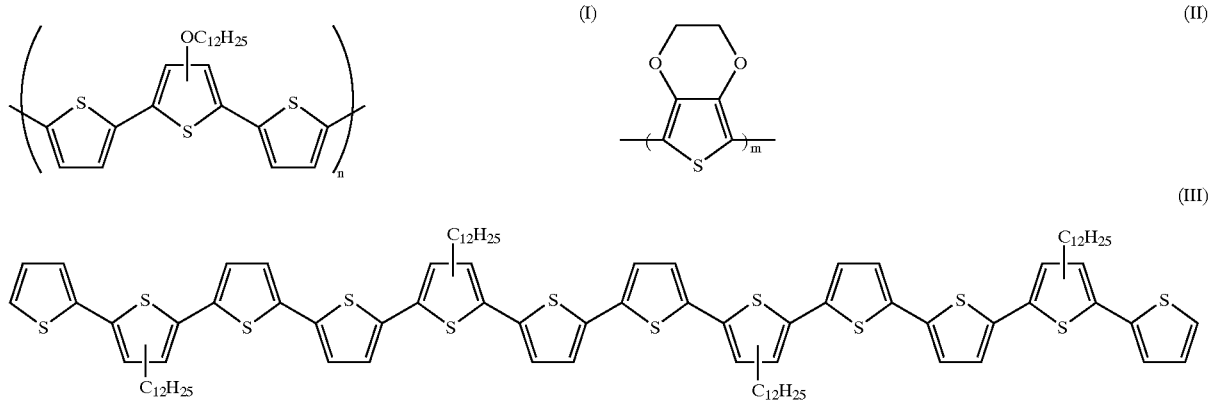

wherein the degree of polymerization n ranges from 2 to 1000 and the degree of polymerization m ranges from 6 to 100.

4. A memory element as claimed in claim 1, characterized in that the polymer is a doped polyaniline.

5. An assembly of independently addressable memory elements, characterized in that the assembly comprises memory elements as claimed in claim 1.

6. A method of electrically writing information while using a memory element as claimed in claim 1, characterized in that a temporary voltage is applied between the electrodes, such that the electroconductivity of the layer is permanently reduced.

7. A method of electrically reading information while using a memory element as claimed in claim 1, characterized in that reading takes place by measuring the electric resistance of the layer between the electrodes.

* * * * *

UNITED STATES PATENT AND TRADEMARK OFFICE
CERTIFICATE OF CORRECTION

PATENT NO. : 6,528,815 B1
DATED : March 4, 2003
INVENTOR(S) : Adam R. Brown et al.

It is certified that error appears in the above-identified patent and that said Letters Patent is hereby corrected as shown below:

<u>Title page,</u>
Insert -- Item [73], Assignee: Koninklijke Philips Electronics N.V., Eindhoven (NL) --.

Signed and Sealed this

Fourteenth Day of October, 2003

JAMES E. ROGAN
*Director of the United States Patent and Trademark Office*